(12) United States Patent
Leitgeb et al.

(10) Patent No.: US 10,045,443 B2
(45) Date of Patent: Aug. 7, 2018

(54) MATCHING INCLINATION OF CAVITY SIDEWALL AND MEDIUM SUPPLY DEVICE FOR MANUFACTURING COMPONENT CARRIER

(71) Applicant: AT & S Austria Technologie & Systemtechnik Aktiengesellschaft, Leoben (AT)

(72) Inventors: Markus Leitgeb, Trofaiach (AT); Gernot Grober, Graz (AT)

(73) Assignee: AT & S Austria Technologie & Systemtechnik Aktiengesellschaft, Leoben (AT)

( * ) Notice: Subject to any disclaimer, the term of this patent is extended or adjusted under 35 U.S.C. 154(b) by 0 days.

(21) Appl. No.: 15/689,348

(22) Filed: Aug. 29, 2017

(65) Prior Publication Data

US 2018/0063965 A1 Mar. 1, 2018

(30) Foreign Application Priority Data

Aug. 29, 2016 (DE) .................. 10 2016 116 034

(51) Int. Cl.
| | | |
|---|---|---|
| *H05K 1/02* | (2006.01) | |
| *H05K 3/32* | (2006.01) | |
| *H01L 33/62* | (2010.01) | |
| *H01L 33/58* | (2010.01) | |
| *H01L 33/48* | (2010.01) | |

(52) U.S. Cl.
CPC .......... *H05K 3/321* (2013.01); *H01L 33/486* (2013.01); *H01L 33/58* (2013.01); *H01L 33/62* (2013.01); *H05K 1/0203* (2013.01); *H01L 2924/07802* (2013.01); *H01L 2924/12042* (2013.01); *H01L 2924/15787* (2013.01)

(58) Field of Classification Search
CPC .............................. H05K 3/321; H05K 1/0203
USPC .......................................................... 174/259
See application file for complete search history.

(56) References Cited

U.S. PATENT DOCUMENTS

| | | | |
|---|---|---|---|
| 5,303,824 A | | 4/1994 | Kohn |
| 6,449,837 B1 | * | 9/2002 | Sergent .................. H01L 24/83 228/223 |
| 7,542,301 B1 | | 6/2009 | Liong et al. |
| 9,113,574 B2 | | 8/2015 | Sato et al. |
| 2003/0057544 A1 | | 3/2003 | Nathan et al. |
| 2006/0147746 A1 | | 7/2006 | Wakako et al. |
| 2008/0007927 A1 | | 1/2008 | Ito et al. |
| 2008/0233353 A1 | | 9/2008 | Sakurai |

(Continued)

FOREIGN PATENT DOCUMENTS

| | | |
|---|---|---|
| DE | 40 12 879 A1 | 3/1991 |
| EP | 1 802 191 A2 | 6/2007 |
| WO | WO 84/03586 A1 | 2/1984 |

*Primary Examiner* — Sherman Ng
(74) *Attorney, Agent, or Firm* — Robert A. Blaha; Smith Tempel Blaha LLC

(57) ABSTRACT

A method of supplying a medium into a cavity of a component carrier or a preform of a component carrier, wherein the method comprises providing the component carrier or the preform of the component carrier with the cavity having a slanted sidewall, providing a medium supply device with a tapering portion and a medium supply opening, and optionally supplying the medium into the cavity while the slanted sidewall and the tapering portion are in alignment with one another.

17 Claims, 3 Drawing Sheets

(56) References Cited

U.S. PATENT DOCUMENTS

2010/0189892 A1* 7/2010 Puik .................. B81C 99/002
                                                              427/189
2012/0186861 A1    7/2012  Shimizu et al.
2013/0194764 A1    8/2013  Mikado et al.
2013/0213697 A1    8/2013  Palaniswamy et al.

* cited by examiner

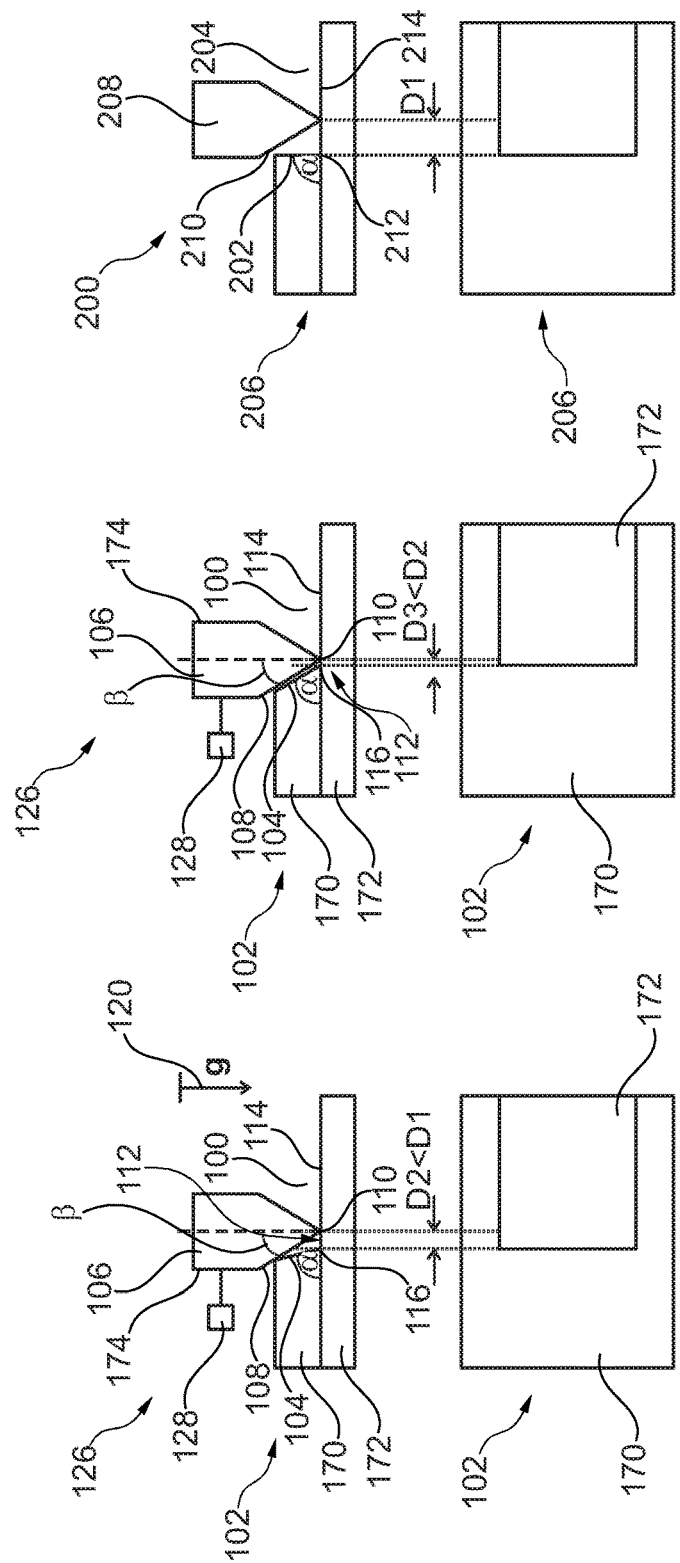

MATCHING INCLINATION OF CAVITY SIDEWALL AND MEDIUM SUPPLY DEVICE FOR MANUFACTURING COMPONENT CARRIER

CROSS-REFERENCE TO RELATED APPLICATIONS

This application claims the benefit of the filling date of German Patent Application No. DE 10 2016 116 034.2 filed Aug. 29, 2016, the disclosure of which is hereby incorporated herein by reference in its entirety.

TECHNICAL FIELD

Embodiments of the present invention relate to a method of supplying a medium into a cavity of a component carrier or a preform thereof, an arrangement of supplying a medium into a cavity of a component carrier or a preform thereof, and a method of matching a shape of a tapering portion of a medium supply device and a shape of a non-vertical sidewall of a cavity. Furthermore, the embodiments of the invention relate to a component carrier or a preform of a component carrier.

TECHNOLOGICAL BACKGROUND

In the context of growing product functionalities of component carriers equipped with one or more electronic components and increasing miniaturization of such electronic components as well as a rising number of electronic components to be mounted on the component carriers such as printed circuit boards, increasingly more powerful array-like components or packages having several electronic components are being employed, which have a plurality of contacts or connections, with even smaller spacing between these contacts. Removal of heat generated by such electronic components and the component carrier itself during operation becomes an increasing issue. At the same time, mounting devices shall be mechanically robust so as to be operable even under harsh conditions.

Manufacturing component carriers, in particular those with embedded electronic component, also involves the formation of cavities in the component carrier and the supply of medium in the cavity (such as adhesive). However, accurate supply of medium in a cavity of a component carrier or a preform thereof is challenging. Inhomogeneous or inaccurate supply of medium in a cavity of the component carrier under manufacture may reduce reliability of the readily manufactured component carrier.

SUMMARY

There may be a need to manufacture component carriers with high reliability.

This need may be met by the subject matter according to the independent claims. Advantageous embodiments of the present invention are described by the dependent claims.

According to an exemplary embodiment of the invention, a method of supplying a medium into a cavity of a component carrier or a preform thereof, an arrangement of supplying a medium into a cavity of a component carrier or a preform thereof, and a method of matching a shape of a tapering portion of a medium supply device and a shape of a non-vertical sidewall of a cavity according to the independent claims are provided.

According to an exemplary embodiment of the invention, a method of supplying a medium into a cavity of a component carrier or a preform of a component carrier is provided, wherein the method comprises providing the component carrier or the preform of the component carrier with the cavity having a slanted (or inclined) sidewall, providing a medium supply device with a tapering (or inclined) portion and a medium supply opening, and optionally supplying the medium into the cavity while the slanted sidewall and the tapering portion are in alignment with one another.

According to another exemplary embodiment of the invention, an arrangement of supplying a medium into a cavity of a component carrier or a preform of a component carrier is provided, wherein the arrangement comprises the component carrier or the preform of the component carrier with the cavity having a slanted (or inclined) sidewall, and a medium supply device with a tapering (or inclined) portion and a medium supply opening.

According to still another exemplary embodiment of the invention, a method of matching a shape of a tapering (or inclined) portion of a medium supply device and a shape of a non-vertical (in particular inclined) sidewall of a cavity of a component carrier or a component carrier under manufacture to one another for enabling supply of medium to an edge region in (and in particular up to an edge of) the cavity via a medium supply opening of the medium supply device is provided.

According to yet another exemplary embodiment of the invention, a component carrier or a preform of a component carrier is provided which comprises a cavity having a planar bottom wall connecting to a slanted sidewall, and a layer of medium covering the (in particular the entire or part of the, the latter for instance in the scenario of applying solder paste) planar bottom wall up to the slanted sidewall (in particular also covering at least a part of the slanted sidewall).

OVERVIEW OF EMBODIMENTS

In the context of the present application, the term "preform of component carrier" may particularly denote a layer structure obtained during manufacturing a component carrier, i.e., a layer structure related to a not yet finished component carrier. In other words, a preform of a component carrier may be a structure corresponding to a component carrier under manufacture.

In the context of the present application, the term "component carrier" may particularly denote any support structure which is capable of accommodating one or more electronic components thereon and/or therein for providing both mechanical support and electrical connectivity. In the context of exemplary embodiments of the invention, such a readily manufactured component carrier may be made subject of a pick-and-place procedure executed by an assembler, during which electronic component is mounted on the component carrier.

According to an exemplary embodiment of the invention, mutually matched geometries or shapes of a slanted sidewall of a cavity and a tapering portion of a medium supply device can be advantageously combined to enable supply of medium to substantially any desired area or region of a cavity. Contrary to conventional approaches, in which a vertical sidewall of a cavity and a tapering geometry of a medium supply device result in a pronounced dead edge in the cavity into which supply of medium is difficult or impossible, an exemplary embodiment aligns cavity sidewall and lateral sidewall of medium supply device to enable to position a medium supply opening at or very close to an edge defined between inclined sidewall and (for instance horizontal) bottom wall of the cavity. By this mutual geometric adjustment between cavity sidewall and assigned local shape of medium supply device next to the medium supply opening, a precise definition of a medium supply position and an amount of medium supplied to a specific position or area in the cavity may be made possible. As a consequence of such an accurate medium supply configuration, also the spatial precision of the mounting characteristic of one of more electronic components in the cavity and on the supplied medium (such as an adhesive material or solderable material) may be improved. This may, in turn, increase the mechanical and electrical reliability of the manufactured component carrier.

In the following, further exemplary embodiments of the arrangement and the methods will be explained.

In an embodiment, the sidewall of the cavity may be inclined with regard to a vertical direction by an angle in a range between 10° and 80°, in particular in a range between 20° and 70°.

In an embodiment, the tapering portion of the medium supply device may be inclined with regard to a vertical direction by an angle in a range between 10° and 80°, in particular in a range between 20° and 70°.

In an embodiment, the method comprises supplying the medium into the cavity while a direct physical contact is established between the slanted sidewall and the tapering portion. When such a contact is established, the medium supply opening may be positioned very close to an edge defined between sidewall and bottom wall of the cavity. An undesired formation of an extended dead surface region in the bottom wall of the cavity, which conventionally cannot be covered with medium, can therefore be reduced or even eliminated.

In an embodiment, the method comprises supplying the medium into the cavity while a surface contact (in particular a contact over a contact line or even a continuous contact area, rather than a point contact) is established between a surface area of the slanted sidewall and a surface area of the tapering portion. This provides guidance and allows performance of the medium supply process with high precision.

In an embodiment, the method comprises supplying the medium into an edge region in the cavity between the slanted sidewall and a bottom wall via the medium supply opening. In particular, the medium may be supplied to an edge of the edge region. In such an edge region or more precisely at such an edge, the inclined sidewall and the horizontal bottom wall may assume an angle which may be larger than 90°. Even at or at least close to a tip of the angle, medium may be applied.

In an embodiment, the cavity is formed so that an edge in the edge region between a bottom plane of the cavity and the slanted sidewall has an obtuse angle, i.e. an angle larger than 90° and smaller than 180°. A portion of the cavity defined by a space relating to a portion of the angle being larger than 90° may then accommodate part of the tapering portion of the medium supply device for spatially approaching the medium supply opening close towards an edge between bottom wall and sidewall of the cavity.

In an embodiment, the tapering portion is formed so that an acute angle is enclosed between a vertical direction (which may extend perpendicular to the planar bottom wall of the cavity) and the tapering portion. This keeps the entire lateral space consumption of the medium supply device in the cavity sufficiently small to provide even small cavities with medium. At the same time, such an acute angle may be capable of functionally cooperating with the obtuse angle of the cavity.

In an embodiment, an absolute value of a difference between the obtuse angle and the acute angle differs from 90° by less than 30°, in particular by less than 10°. In other words, the deviation of an actual geometry from a completely parallel configuration of the cavity sidewall with regard to the slanted medium supply device (in a side view of the arrangement) may be sufficiently small so that medium can be supplied over substantially the entire bottom surface of the cavity. The mentioned small angular variations may be sufficient to enable slightly flowable medium (such as liquid adhesive) to flow also in very small remaining hidden surface portions very close to the sidewall of the cavity.

In an embodiment, at least a section of the slanted sidewall and at least a section of the tapering portion are substantially (or even completely) parallel. In such a configuration, substantially no hidden surface portions remain so that the freedom of a circuit designer of defining surface portions of the cavity to be covered with medium is very high.

In an embodiment, the medium is supplied homogeneously, in particular with substantially constant thickness, over substantially an entire bottom wall of the entire cavity or part thereof. As a consequence, undesired effects such as a tilting of an electronic component placed on inhomogeneously applied medium in the cavity can be safely prevented. This increases reliability of the manufactured component carrier.

In an embodiment, the cavity is formed by treating the component carrier with a laser. When parameters (such as power, irradiation time, wavelength, laser type, used materials) of the laser drilling procedure are properly adjusted, a slanted sidewall of the formed cavity may be obtained, and even a slanting angle may be selected.

In an embodiment, the cavity is formed by milling using a tapering milling tool. More specifically, a tapering angle of a milling tool may translate into a corresponding inclination angle or slanting angle of a cavity formed by milling.

In an embodiment, the medium supply opening is driven up to an edge of the edge region. In such an embodiment, full coverage of the entire bottom surface of the cavity is possible.

In an embodiment, the tapering portion is a conically tapering portion, i.e. the tapering portion has the external shape of a cone. Such an embodiment may for instance be implemented advantageously with a dispensing device as medium supply device. Such a conical tapering portion may substantially serve as an entire circumferential slanted sidewall of the cavity. Hence, when a corresponding medium supply device is moved by a drive unit (such as a motor) along the entire circumference of the slanted sidewall of the cavity, full coverage of the entire bottom wall may be made possible.

In an embodiment, the tapering portion extends up to the medium supply opening at an end of the tapering portion. In such a configuration, a matching between the tapering portion of the medium supply device and the slanted sidewall translates into a specifically pronounced improvement in terms of the opportunity of applying medium via the medium supply opening onto substantially any desired surface portion of the bottom wall of the cavity.

In an embodiment, the tapering portion comprises at least one slanted planar sidewall. In particular, the at least one slanted planar sidewall may lead to a planar bottom wall in which the medium supply opening is formed. Such an embodiment may for instance be implemented advantageously with a screen-printing device as a medium supply device. In an embodiment implementing a screen-printing device, a screen having one or more clearances, openings or through holes may be placed in the cavity. Subsequently, medium may be applied on top of the screen and may traverse the one or more through holes so as to cover specific surface portions of the component carrier or the preform of the component carrier in the cavity. A squeegee may then be moved over the screen to ensure proper supply of medium and removal of excessive medium. In one embodiment, such a medium supply device may have four slanted planar sidewalls along a circumference thereof. Such a configuration may correspond to a configuration of the cavity with four slanted sidewalls along a circumference thereof.

In an embodiment, the arrangement comprises a control unit (for example a process controller, for instance a processor such as a microprocessor or a central processing unit, CPU) configured for controlling supply of the medium into the cavity while the slanted sidewall and the tapering portion are in alignment with one another. In particular, the control unit may be configured for supplying the medium into an edge region in the cavity between the slanted sidewall and a bottom wall via the medium supply opening. The control unit may control a drive unit to drive the medium supply device to a specific position of the cavity. The control unit may then trigger a start or application of the medium supply via the medium supply unit when the medium supply device has reached its destination. The control unit may then optionally control the drive unit to move the medium supply device to scan the medium supply device (and in particular its medium supply opening) along a partial or an entire surface of the cavity. During such a control, the control unit may take into account the fact that, due to the inclination of both the cavity sidewall and the sidewall of the medium supply device, the medium supply opening may be driven up to or close to the edge of the cavity.

In an embodiment, the medium supply device is configured for supplying at least one of the group consisting of solder mask, solder paste, a surface finish, and an adhesive. Solder paste may be used for establishing an electrically conductive and mechanical solder connection between, on the one hand, an electronic component mounted in the cavity with medium applied thereon and, on the other hand, at least one electrically conductive layer structure of the component carrier under manufacture. Electrically insulating adhesive or electrically conductive adhesive may be used for establishing an electrically insulating or conductive connection between, on the one hand, an electronic component mounted in the cavity with medium applied thereon and, on the other hand, at least one electrically conductive layer structure and/or at least one electrically insulating layer structure of the component carrier under manufacture. A surface finish may be used for constituting a surface of the component carrier to be manufactured. In other embodiments, any other liquid, solid, etc. medium can be applied to part of or the entire bottom surface of the cavity.

In an embodiment, the medium supply device is a dispenser. A dispenser may comprise a tubular member with a hollow lumen through which medium to be dispensed or applied can be transported. At an open flange face of an inclined or tapering end section of such a dispenser, the medium may pass out of the tubular member onto a surface portion of the cavity.

In another embodiment, the medium supply device is a screen-printing device. A screen-printing device may comprise a screen with at least one through hole as medium supply opening through which medium to be dispensed or applied can be transported. At least part of the screen may be placed in the cavity to partially cover the latter. Subsequently, medium to be applied may be supplied from an upper side of the screen and may pass at one or more defined positions through the at least one through hole (which may define a pattern according to which the medium shall be applied to only selective surface portions of the cavity wall). A squeegee may then move over the screen to promote passage of medium through the at least one through and to remove excessive medium from an upper side of the screen.

In an embodiment, the component carrier (more precisely the component carrier under manufacture or the preform of the component carrier or the readily manufactured component carrier) comprises a stack of at least one electrically insulating layer structure and at least one electrically conductive layer structure. For example, the component carrier may be a laminate of the mentioned electrically insulating layer structure(s) and electrically conductive layer structure(s), in particular formed by applying mechanical pressure, if desired supported by thermal energy. The mentioned stack may provide a plate-shaped component carrier capable of providing a large mounting surface for further electronic components and being nevertheless very thin and compact. The term "layer structure" may particularly denote a continuous layer, a patterned layer or a plurality of non-consecutive islands within a common plane.

In an embodiment, the component carrier (more precisely the component carrier under manufacture or the preform of the component carrier or the readily manufactured component carrier) is shaped as a plate. This contributes to a compact design, wherein the component carrier nevertheless provides a large basis for mounting electronic components thereon and/or therein. Furthermore, in particular a naked die as example for an embedded electronic component, can be conveniently embedded, thanks to its small thickness, into a thin plate such as a printed circuit board.

In an embodiment, the component carrier (more precisely the component carrier under manufacture or the preform of the component carrier or the readily manufactured component carrier) is configured as one of the group consisting of a printed circuit board, an organic Interposer and an IC (integrated circuit) substrate, or a hybrid board comprising different mentioned groups mentioned before.

In the context of the present application, the term "printed circuit board" (PCB) may particularly denote a plate-shaped component carrier which is formed by laminating several electrically conductive layer structures with several electrically insulating layer structures, for instance by applying pressure, if desired accompanied by the supply of thermal energy. As preferred materials for PCB technology, the electrically conductive layer structures are made of copper, whereas the electrically insulating layer structures may comprise resin and/or glass fibers, so-called prepreg or FR4 material. The various electrically conductive layer structures may be connected to one another in a desired way by forming blind holes or through-holes through the laminate, for instance by laser drilling or mechanical drilling, and by filling them with electrically conductive material (in particular copper), thereby forming vias as through-hole connections. Apart from one or more electronic components which may be embedded in a printed circuit board, a printed circuit board is usually configured for accommodating one or more electronic components on one or both opposing surfaces of the plate-shaped printed circuit board. They may be connected to the respective main surface by soldering.

In the context of the present application, the term "IC substrate" may particularly denote a small component carrier having either substantially the same size or a size of more than 1.2 times larger as an electronic component to be mounted thereon.

In an embodiment of the arrangement, the component carrier or the preform of the component carrier comprises an electronic component mounted on and/or embedded in the stack. Such an electronic component may be mounted in the cavity with a slanted side wall after the medium has been supplied to the bottom wall of the cavity. In the context of the present application, the term "electronic component" may particularly denote any bulky rather than layer-type active (such as a semiconductor chip) or passive (for instance a resistor or a copper block) component embedded within an interior of the component carrier.

In an embodiment, the at least one electronic component is selected from a group consisting of an active electronic component, a passive electronic component, an electronic chip, a storage device, a filter, an integrated circuit, a signal processing component, a power management component, an optoelectronic interface element, a voltage converter, a cryptographic component, a transmitter and/or receiver, an electromechanical transducer, a sensor, an actuator, a microelectromechanical system, a microprocessor, a capacitor, a resistor, an inductance, a battery, a switch, a camera, an antenna, and a logic chip. However, other electronic components may be embedded in the component carrier. For example, a magnetic element can be used as an electronic component. Such a magnetic element may be a permanent magnetic element (such as a ferromagnetic element, an antiferromagnetic element or a ferrimagnetic element, for instance a ferrite core) or may be a paramagnetic element. However, the electronic component may also be a further component carrier, for example in a board-in-board configuration.

In an embodiment, the at least one electrically insulating layer structure comprises at least one of the group consisting of resin (such as reinforced or non-reinforced resins, for instance epoxy resin), in particular Epoxy resin, Bismaleimide-Triazine resin, cyanate ester, glass (in particular glass fibers, glass spheres, multi-layer glass or glass-like materials), prepreg material, polyimide, polyamide, liquid crystal polymer, epoxy-based Build-Up Film, FR4 material, FR5 material, polytetrafluoroethylene (Teflon), a ceramic, and a metal oxide. Although prepreg or FR4 are usually preferred, other materials may be used as well.

In an embodiment, the at least one electrically conductive layer structure comprises at least one of the group consisting of copper, aluminum, nickel, silver, gold, palladium, and tungsten. Although copper is usually preferred, other materials are possible as well.

In an embodiment, the component carrier is a laminate-type component carrier. In such an embodiment, the component carrier is a compound of multiple layer structures which are stacked and connected together by applying a pressing force, if desired accompanied by heat.

The aspects defined above and further aspects of the invention are apparent from the examples of embodiment to be described hereinafter and are explained with reference to these examples of embodiment.

BRIEF DESCRIPTION OF THE DRAWINGS

FIG. 1 illustrates an arrangement for supplying medium to a cavity of a component carrier under manufacture using a dispenser according to an exemplary embodiment of the invention.

FIG. 2 illustrates an arrangement for supplying medium to a cavity of a component carrier under manufacture using a dispenser according to another exemplary embodiment of the invention.

FIG. 3 illustrates a conventional arrangement.

DETAILED DESCRIPTION OF ILLUSTRATED EMBODIMENTS

Figure 4:
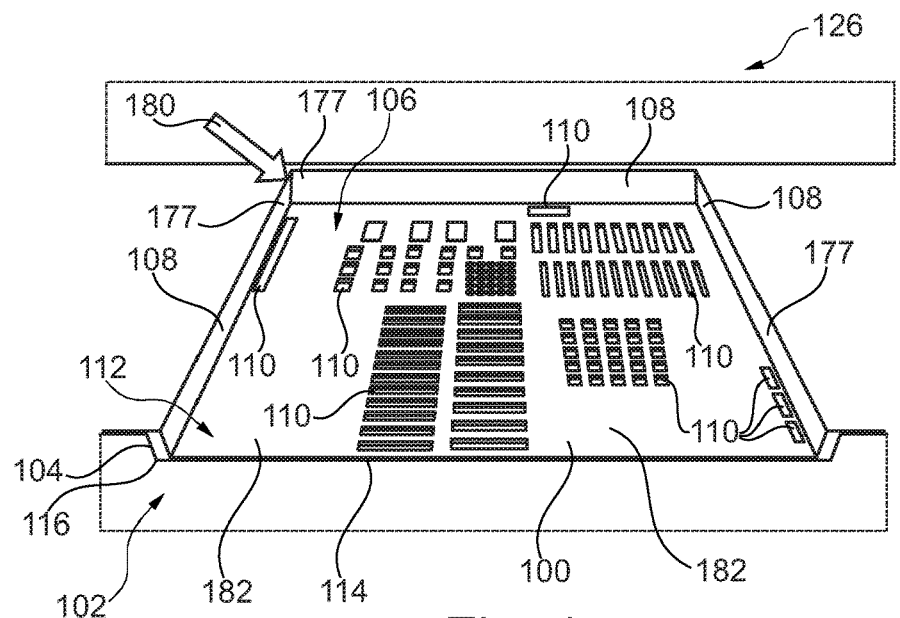
FIG. 4 illustrates an arrangement for supplying medium to a cavity of a component carrier under manufacture using a screen-printing device according to another exemplary embodiment of the invention.

The illustrations in the drawings are presented schematically. In different drawings, similar or identical elements are provided with the same reference signs.

Before, referring to the drawings, exemplary embodiments will be described in further detail, some basic considerations will be summarized based on which exemplary embodiments of the invention have been developed.

According to an exemplary embodiment of the invention, a slanted side wall configuration of a cavity of a component carrier under manufacture is combined with a medium supply device having a tapering portion leading or ending into the supply opening.

When applying a medium into a cavity, a dispensing unit or other medium supply device cannot be placed directly at the cavity wall due to the conventionally conical exterior geometry of the medium supply device and the conventionally vertical geometry of the cavity sidewall.

Cavities are widely used in the electronics industry. Such cavities can be used for sinking electronic components below the surface as well as for recessing of electronic components in a component carrier. For applying an adhesive layer or a solder layer on the bottom wall of such a cavity, a dispensing device or a jetting device may be used, because they allow for a very precise control in the vertical direction. However, such medium supply devices comprise a conically tapering shape in order to be able to place the medium spatially accurately on a defined position in a horizontal plane. However, due to the conical tapering of such a medium supply device in combination with the vertical side wall of the cavity, a minimum distance always remains between medium supply opening and edge of the cavity in a conventional geometry.

According to an exemplary embodiment of the invention, the geometry of the cavity sidewall is matched to the tapering geometry of the medium supply device next to the medium supply opening. For instance, such an adjustment may be realized by manufacturing the cavity at least partially by laser drilling (with correspondingly adjusted laser parameters) and/or by milling (using a correspondingly adjusted geometry of the milling tool and/or a milling procedure). In other words, a matching of the inclination of the cavity walls with regard to the inclination of a medium supply device adjacent a medium supply opening allows to apply one or more media within the cavity closer to the sidewall of the cavity. Thus, dead corners between sidewall and bottom wall of the cavity in terms of applying medium can be reduced or even completely eliminated according to exemplary embodiments of the invention. Therefore, the full cavity area can be used in an optimum manner in a horizontal plane. Moreover, an electronic component may be mounted in the cavity on the applied medium in a more precise way as a consequence of the homogeneous property of a layer of medium which can be formed in the described way. Such embodiments of the invention may be implemented with various kinds of medium supply devices such as dispensing devices, screen-printing devices, inkjet devices, aerosol jet devices, etc.

FIG. 1 illustrates an arrangement 126 for supplying medium to a recess-type cavity 100 of a component carrier to be manufactured using a dispenser according to an exemplary embodiment of the invention. Since the component carrier 102 is still under manufacture according to FIG. 1, it may also be denoted as a preform of a readily manufactured component carrier 102. In FIG. 1, as in FIG. 2 and FIG. 3 in a corresponding way, both a cross-sectional view (see respective upper illustration) and a plan view (see respective lower illustration) are shown. However, alternatively, the entire procedure can be carried out based on a readily manufactured component carrier 102.

The arrangement 126 shown in FIG. 1 is a manufacturing assembly which can be used for supplying any viscous, liquid or solid medium, such as a liquid adhesive or a solder paste, onto a selective surface portion of a pre-formed cavity 100 of a component carrier 102 or a preform of a component carrier 102. For instance, the component carrier 102 under manufacture may be a printed circuit board (PCB) with an electronic component (see reference numeral 130 in FIG. 10) to be recessed within the cavity 100.

The arrangement 126 comprises the already mentioned component carrier 102 or preform of the component carrier 102 with the cavity 100. As can be taken from FIG. 1, the cavity 100 has an inclined (i.e. neither vertical nor horizontal) or slanted sidewall 104 rather than a vertical sidewall. The component carrier 102 or preform of the component carrier 102 may be a substantially plate-shaped laminated stack of electrically conductive layer structures (for instance planar metal structures, such as complete or patterned copper foils, electrically connected to metallic vertical through connections, such as plated copper vias) and electrically insulating layer structures (for instance comprising a resin matrix, such as epoxy resin, with reinforcing fibers therein, for instance glass fibers). The electrically insulating layer structures may be made of prepreg or FR4.

In the shown embodiment, the component carrier 102 or preform of the component carrier 102 is composed of a core 172 which may be made of fully cured material (such as FR4) with an electrically insulating layer structure 170 (for instance a prepreg layer) connected therewith. It is also possible that a release layer (not shown) is arranged between core 172 and electrically insulating layer structure 170.

However, the composition of the component carrier 102 or the preform of the component carrier 102 may broadly vary as long as a cavity 100 with slanted sidewall 104 is provided as part of the stack. For instance, reference numerals 170 and 172 may alternatively also represent two adjacent levels or layers of a PCB stack. Further alternatively, reference numeral 170 may denote a core which may be made of fully cured material (such as FR4) with a sticky tape (which can then form reference numeral 172) connected therewith as a temporary carrier for temporarily carrying an electronic component (see reference numeral 130 in FIG. 10) to be placed in the cavity 100. In yet another exemplary embodiment, the component carrier 102 or preform thereof may be embodied as a rigid flex board, wherein an electrically insulating medium may be applied at a transition between the rigid portion and the flexible portion (which may correspond to the cavity 100). This medium shall protect the transition region and increase reliability.

The slanted sidewall 104 can be provided along an entire circumference (which is rectangular in the shown embodiment as can be taken partially from the shown plan view) of the cavity 100. The slanted sidewall 104 can be manufactured by a laser treatment, or by milling using a correspondingly shaped milling tool.

A medium supply device 106, which is here embodied as a dispensing device, with a conically tapering portion 108 and a medium supply opening 110 also forms part of the arrangement 126. In the shown embodiment, the medium supply device 106 comprises a tubular member 174 with a hollow lumen which can be filled with the medium to be applied. An open lower end of the tubular member 174 constitutes the medium supply opening 110. The medium supply opening 110 is located at a narrow end tip, thereby allowing to obtain a high spatial accuracy when applying medium onto a precisely definable surface position of a bottom wall 114 of the cavity 100. In the shown embodiment, the tubular member 174 has an upper cylindrical portion connected to a lower conically tapering portion 108 which ends at the end tip defining the medium supply opening 110. Thus, the tapering portion 108 is a conical portion leading to the medium supply opening 110 at an end of the tapering portion 108.

Furthermore, the arrangement 126 comprises a schematically shown control unit 128, such as a processor on which executable software code is executable. The control unit 128 is configured for controlling the process of supplying the medium into the cavity 100, and in particular to an edge region 112 of the cavity 100 while the slanted sidewall 104 and the tapering portion 108 are in alignment with one another (as shown in FIG. 1). The control unit 128 may hence trigger start and stop of a medium supply interval during which medium is supplied via the tubular member 174 and leaves the latter through the medium supply opening 110 so as to be applied onto a corresponding surface position of bottom wall 114 of the cavity 100. Before triggering the start of the medium supply procedure, the control unit 128 may control a drive unit (such as a motor, not shown) to drive the medium supply device 106 to a corresponding position above the bottom wall 114 of the cavity 100. Due to the fact that mutually facing surface portions of both the slanted sidewall 104 as well as the conically tapering portion 108 are inclined towards the same direction (i.e. counterclockwise according to FIG. 1) with regard to a vertical direction 120, it is possible that the control unit 128 controls the medium supply device 106 to move very close towards the sidewall 104. This motion may continue until the conically tapering portion 108 abuts against the sidewall 104. In this position, it is possible for the medium supply device 106 to dispense medium very close to an edge 116 of the cavity 100.

By such a procedure, it is possible to apply a layer of adhesive medium onto substantially the entire bottom wall 114 (or any precisely definable sub-portion thereof) with a homogeneous thickness. This renders it possible to mount an electronic component 130 (such as a semiconductor chip) on the adhesive medium and in the cavity 100 in a highly reproducible manner (not shown in FIG. 1) in terms of position and orientation. This allows to obtain a high registration accuracy and reliability of the manufactured component carrier 102 with recessed electronic component 130.

Hence, with the arrangement 126 shown in FIG. 1, a method of supplying medium into the cavity 100 of the component carrier 102 or the preform of the component carrier 102 can be carried out. This method comprises the procedures of providing the component carrier 102 or the preform of the component carrier 102 with the cavity 100 having the slanted sidewall 104, providing the medium supply device 106 with the tapering portion 108 and the medium supply opening 110, and supplying the medium into the cavity 100 while the slanted sidewall 104 and the tapering portion are in alignment with one another. The supply of the medium into the cavity 100 may be carried out while a direct physical contact is established between the slanted sidewall 104 and the conically tapering portion 108. This allows to supply the medium into edge region 112 in the cavity 100 between the slanted sidewall 104 and bottom wall 114 via the medium supply opening 110.

As can be taken from FIG. 1, the cavity 100 is formed so that edge 116 in the edge region 112 between bottom surface 114 of the cavity 100 and the slanted sidewall 104 has an obtuse angle 180°−α>90°, wherein a is shown in FIG. 1. Moreover, the tapering portion 108 may be formed so that acute angle β<90° is enclosed between the vertical direction 120 and the tapering portion 108. Although in the shown embodiment α+β deviates slightly from 90°, an improvement is achieved in terms of the freedom to cover also a region very close to the edge 116 by the configuration of FIG. 1 in comparison to a conventional configuration as the one shown in FIG. 3.

FIG. 2 illustrates an arrangement 126 for supplying medium to a cavity 100 of a component carrier 102 or a preform of a component carrier 102 using a dispenser according to another preferred exemplary embodiment of the invention.

The embodiment according to FIG. 2 differs from the embodiment according to FIG. 1 in that, according to FIG. 2, a portion of the slanted sidewall 104 and a corresponding portion of the tapering portion 108 are parallel to one another in the side view. Consequently, it is possible according to FIG. 2 that the medium supply opening 110 is driven up to edge 116 of the edge region 112. Hence, the medium may be supplied into the cavity 100 while an line-type surface contact is established between a surface area of the slanted sidewall 104 and a surface area of the tapering portion 108. This makes it possible that the medium is supplied also to the edge 116 of the edge region 112. According to FIG. 2, α+β=90°. In a preferred embodiment, the condition α+β≈90° is fulfilled.

FIG. 3 illustrates a conventional arrangement 200 with a vertical sidewall 202 of a cavity 204 in a component carrier preform 206 and with a medium supply device 208 with a conically tapering portion 210. In this conventional geometry, it is only possible to apply medium up to a position being spaced with regard to or being remote from an edge 212 between the vertical sidewall 202 and horizontal bottom wall 214 of the cavity 204. The result of such a configuration are reliability issues and lack of spatial reproducibility when recessing an electronic component (not shown) in the cavity 204 which can only be partially covered with adhesive in an inhomogeneous manner and with severe limitations as a consequence of the shown geometry.

As can be taken from FIG. 3, a large gap with an extension D1 starting from the edge 212 up to the open end tip of the medium supply device 208 remains uncovered from medium, thereby leaving a pronounced dead area uncovered of medium.

As can be taken from FIG. 1, only a significantly smaller gap with an extension D2<D1 starting from the edge 116 remains uncovered from medium, thereby reducing the dead area to an acceptably small region. This region can still be covered by medium when adhesive with appropriate viscosity properties is implemented.

As can be taken from FIG. 2, an almost vanishing gap with an extension D3<D2 starting from the edge 116 remains uncovered from medium (D3->0), thereby substantially eliminating the dead area. Already a small flowability of medium is then sufficient to cover the entire bottom wall 114 of the cavity with medium, if desired or required.

FIG. 4 illustrates an arrangement 126 for supplying medium to a cavity 100 of a component carrier 102 using a screen-printing device as medium supply device 106 according to another exemplary embodiment of the invention.

According to FIG. 4, the tapering portion 108 of the medium supply device 106 comprises two pairs of respectively opposing, i.e. altogether up to four (although only three are shown), slanted planar sidewalls 177 leading to a planar bottom wall 182 in which the medium supply opening 110 is formed. A sloped edge is indicated by an arrow 180. Each of the planar sidewalls 177 of the medium supply device 106 is parallel to a respective one of the slanted sidewalls 104 of the cavity 100.

The mentioned planar sidewalls 177 and the planar bottom wall 182 (integrally formed therewith) form part of a screen of the medium supply device 106. The screen is provided with a pattern of through holes as medium supply opening 110 through which medium to be screen printed can be transported onto corresponding surface portions of the bottom wall 114 of the cavity 100. As can be taken from FIG. 4, the screen has been placed in the cavity 100 to partially cover the latter so that the planar bottom wall 182 of the medium supply device 106 and the planar bottom wall 114 of the cavity 100 are aligned parallel to one another. Subsequently, medium to be applied may be supplied from an upper side of the screen and may pass at defined positions through the through holes to thereby define a pattern according to which the medium is applied to only selective surface portions of the bottom wall 114 of the cavity 100. A squeegee (not shown) may then move over the screen to promote passage of medium through the through holes and to remove excessive medium from an upper side of the screen.

In view of the parallel alignment between the tapering portion 108 of the medium supply device 106 and the slanted planar sidewalls 104 of the cavity 100, medium can be applied also very close and even up to the sidewalls 104 of the cavity 100.

FIG. 5, FIG. 6, FIG. 7, FIG. 8, FIG. 9 and FIG. 10 illustrate cross-sectional views of structures obtained during carrying out a method of manufacturing a component carrier 102 with embedded electronic component 130, which involves supplying medium to a cavity 100 of the component carrier 102 under manufacture according to an exemplary embodiment of the invention.

Figure 5:
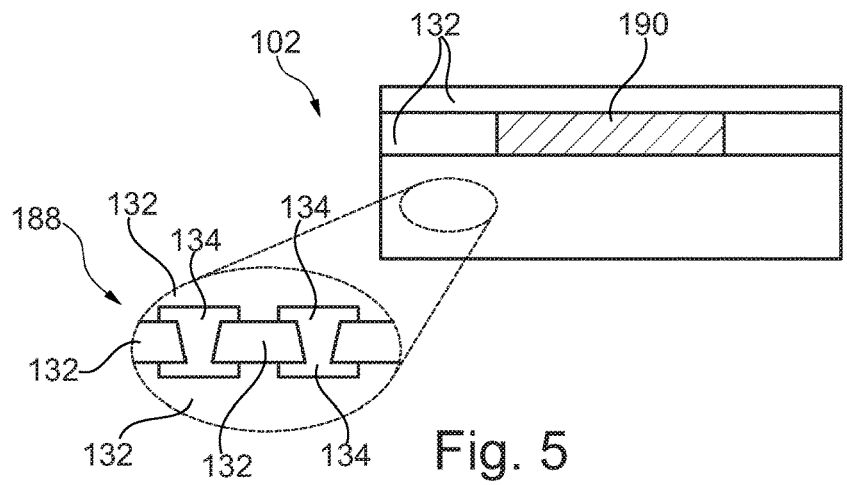
FIG. 5, FIG. 6, FIG. 7, FIG. 8, FIG. 9 and FIG. 10 illustrate respective cross-sectional views of structures obtained during performance of a method of manufacturing a component carrier, which involves supplying medium to a cavity of the component carrier under manufacture according to an exemplary embodiment of the invention.

Referring to FIG. 5, a preform of the component carrier 102 under manufacture is shown which comprises a laminated stack of electrically insulating layer structures 132 and electrically conductive layer structures 134 (see detail 188). The electrically conductive layer structures 134 may be made of copper and comprise both planar sections as well as vertical through connections. The electrically insulating layer structures 132 may be made of resin with fibers, for instance may be made of prepreg material, which may be cured by laminating (i.e. the application of pressure and/or heat). A release layer 190 (for instance made of a waxy material or any other material which does not adhere to adjacent material of the laminated layer stack) may be provided in an interior of the laminated layer stack.

Figure 6:
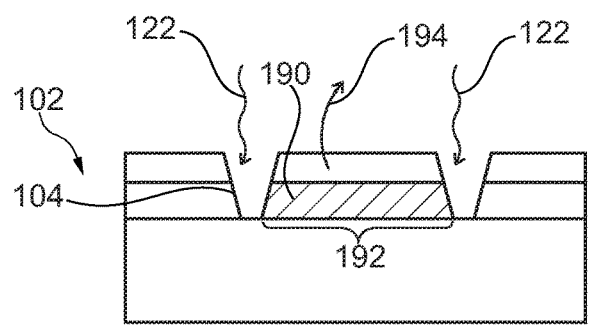

Referring to FIG. 6, cavity 100 may be formed by treating the pre-form of the component carrier 102 according to FIG. 5 with a laser 122. As a consequence of this laser treatment, an annular recess with slanted sidewalls 104 may be formed in the preform of the component carrier 102 extending up to the release layer 190. Since the release layer 190 is made of a material with poor adhesion to adjacent laminate material, a central body 192 delimited by the annular laser hole and the release layer 190 may be removed from the rest of the laminate, as indicated by reference numeral 194. By adjusting the parameters of the laser treatment (such as laser power, laser type, wavelength, irradiation time, annular motion velocity, etc.), the characteristics (in particular the inclination angle) of the slanted sidewall 104 of the cavity 100 to be formed can be defined and can be designed to match to a given tapering angle of a medium supply device 106 (not shown in FIG. 6).

Figure 7:
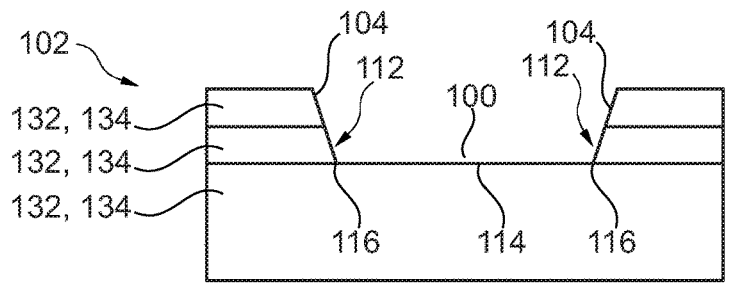

Referring to FIG. 7, the resulting cavity 100 is illustrated.

Figure 8:
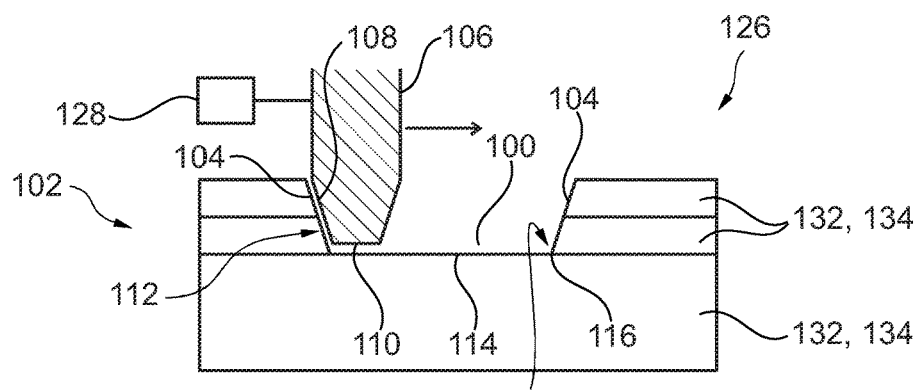
Figure 9:
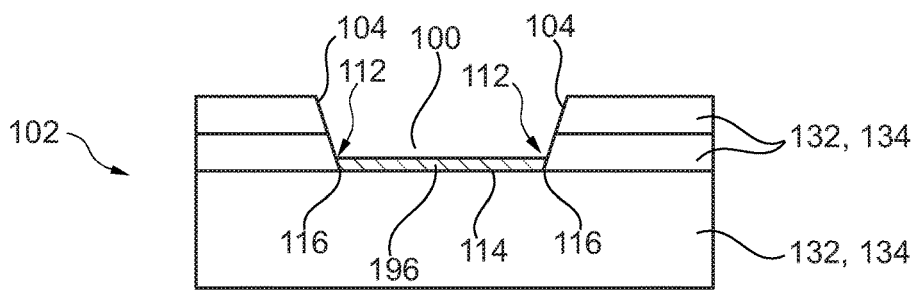

Referring to FIG. 8, medium supply device 106 with tapering portion 108 is inserted into the cavity 100 in alignment with slanted sidewall 104. Dispensing of medium may be initiated by control unit 128. To form a homogeneous layer 196 (see FIG. 9) of medium, the medium supply device 106 may be moved along the horizontal surface of the cavity 100 by a drive unit (such as a motor, not shown) under control of the control unit 128.

Figure 10:
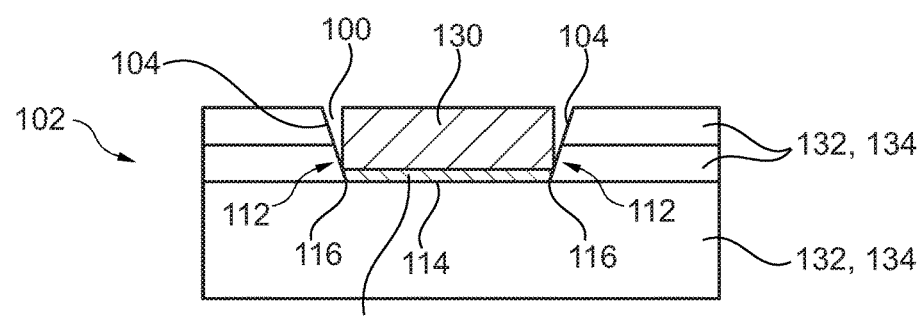

Referring to FIG. 10, electronic component 130 (such as a battery or a semiconductor chip) may be placed on the homogeneous layer 196.

Although not shown, the structure according to FIG. 10 may be made subject of further processing to complete embedding of the electronic component 130 and manufacture of component carrier 102. For instance, at least one further electrically insulating layer structure 132 and/or at least one further electrically conductive layer structure 134 may be laminated on top and/or on bottom of the structure shown in FIG. 10. Electrically conductive contacts from an exterior to the recessed electronic component 130 may be formed.

Thus, the result of the described manufacturing procedure is the illustrated component carrier 102 or preform thereof according to an exemplary embodiment of the invention, which comprises the cavity 100 having the planar bottom wall 114 connecting directly to the slanted sidewall 104, and the layer 196 of a medium at least partially covering the planar bottom 114 up to the slanted sidewall 104.

It should be noted that the term "comprising" does not exclude other elements or steps and the "a" or "an" does not exclude a plurality. Also elements described in association with different embodiments may be combined.

It should also be noted that reference signs in the claims shall not be construed as limiting the scope of the claims.

Implementation of the invention is not limited to the preferred embodiments shown in the figures and described above. Instead, a multiplicity of variants are possible which use the solutions shown and the principle according to the invention even in the case of fundamentally different embodiments.

The invention claimed is:

1. A method of supplying a medium into a cavity of a component carrier or a preform of a component carrier, the method comprising: providing the component carrier or the preform of the component carrier with the cavity having a slanted sidewall; providing a medium supply device with a tapering portion and a medium supply opening, wherein the method further comprises: supplying the medium into the cavity while the slanted sidewall and the tapering portion are in alignment with one another, and wherein at least a section of the slanted sidewall and at least a section of the tapering portion are substantially parallel to one another.

2. The method according to claim 1, wherein the method comprises at least one of the following features: supplying the medium into the cavity while a contact is established between the slanted sidewall and the tapering portion; supplying medium into the cavity while a surface contact is established between a surface area of the slanted sidewall and a surface area of the tapering portion.

3. The method according to claim 1, wherein the method comprises supplying medium into an edge region in the cavity between the slanted sidewall and a bottom wall via the medium supply opening, wherein medium is supplied to an edge of the edge region.

4. The method according to claim 1, comprising at least one of the following features: wherein the cavity is formed so that an edge in an edge region between a planar bottom wall of the cavity and the slanted sidewall has an obtuse angle; wherein the tapering portion is formed so that an acute angle is enclosed between a vertical direction and the tapering portion; wherein the cavity is formed so that an edge in an edge region between a planar bottom wall of the cavity and the slanted sidewall has an obtuse angle; wherein the tapering portion is formed so that an acute angle is enclosed between a vertical direction and the tapering portion, and wherein an absolute value of a difference between the obtuse angle and the acute angle differs from 90° by less than 30°.

5. The method according to claim 1, wherein the medium is supplied homogeneously or as close as possible to the slanted sidewall of the cavity, with substantially constant thickness, over at least a part of a bottom wall of the cavity.

6. The method according to claim 1, comprising at least one of the following features: wherein the slanted sidewall of the cavity is formed by treating the component carrier or the preform of the component carrier with a laser; wherein the slanted sidewall of the cavity is formed by milling using a tapering milling tool.

7. The method according to claim 1, wherein the medium supply opening of the medium supply device is driven to an edge of the cavity before or during supplying the medium.

8. The method according to claim 1, comprising at least one of the following features: wherein the tapering portion is a conically tapering portion; wherein the tapering portion extends up to the medium supply opening at an end of the tapering portion.

9. The method according to claim 1, wherein the tapering portion comprises at least one slanted planar sidewall, wherein the at least one slanted planar sidewall leads to a planar bottom wall of the medium supply device in which the medium supply opening is formed.

10. An arrangement of supplying a medium into a cavity of a component carrier or a preform of a component carrier, the arrangement comprising: a component carrier or a preform of the component carrier with the cavity having a slanted sidewall; a medium supply device with a tapering portion and a medium supply opening; and a control unit configured for controlling a supply of the medium into the cavity with the slanted sidewall and the tapering portion being in alignment with one another such that the slanted sidewall and the tapering portion are substantially parallel to one another.

11. The arrangement according to claim 10, comprising at least one of the following features: wherein the medium supply device is configured for supplying at least one medium of the group consisting of a solder paste, a surface finish, and an adhesive; wherein the medium supply device comprises a dispenser; wherein the medium supply device comprises a screen-printing device.

12. The arrangement according to claim 10, wherein the component carrier or the preform of the component carrier comprises an electronic component mounted in the cavity, wherein the electronic component is selected from a group consisting of an active electronic component, a passive electronic component, an electronic chip, a storage device, a filter, an integrated circuit, a signal processing component, a power management component, an optoelectronic interface element, a voltage converter, a cryptographic component, a transmitter and/or receiver, an electromechanical transducer, a sensor, an actuator, a microelectromechanical system, a microprocessor, a capacitor, a resistor, an inductance, a battery, a switch, a camera, an antenna, a magnetic element, a logic chip, and a further component carrier.

13. The arrangement according to claim 10, wherein the component carrier or the preform of the component carrier comprises at least one electrically insulating layer structure and/or at least one electrically conductive layer structure, wherein the at least one electrically conductive layer structure comprises at least one of the group consisting of copper, aluminum, and nickel, wherein the at least one electrically insulating layer structure comprises at least one of the group consisting of resin Epoxy resin, Bismaleimide-Triazine resin, cyanate ester, glass, glass fibers, prepreg material, polyimide, polyamide, polytetrafluoroethylene, liquid crystal polymer, epoxy-based Build-Up Film, FR4 material, FR5 material, a ceramic, and a metal oxide.

14. The arrangement according to claim 10, wherein the component carrier or the preform of the component carrier is shaped as a plate.

15. The arrangement according to claim 10, comprising at least one of the following features: wherein the component carrier or the preform of the component carrier is configured as one of the group consisting of a printed circuit board, and an integrated circuit substrate; the arrangement is configured as a laminate-type component carrier.

16. A method, comprising: matching a tapered portion of a medium supply device and a non-vertical sidewall of a cavity of a component carrier or of a component carrier under manufacture to one another; and providing a supply of a medium to an edge region in the cavity via a medium supply opening of the medium supply device while the non-vertical sidewall and the tapered portion are in alignment with one another such that the non-vertical sidewall and the tapered portion are substantially parallel to one another.

17. A component carrier or a preform of a component carrier, comprising: a cavity having a planar bottom connected to a slanted sidewall; and a layer of medium at least partially covering the planar bottom up to the slanted sidewall, the layer of medium being supplied by a medium supply device having a tapering portion and a medium supply opening, wherein the slanted sidewall and the tapering portion are in alignment with one another such that the slanted sidewall and the tapering portion are substantially parallel to one another.

* * * * *